United States Patent
Jiang et al.

(10) Patent No.: US 6,319,330 B1
(45) Date of Patent: Nov. 20, 2001

(54) METHOD AND APPARATUS FOR CLEANING LOW K DIELECTRIC AND METAL WAFER SURFACES

(75) Inventors: Linda (Tong) Jiang, Fremont; Diane J. Hymes, San Jose, both of CA (US)

(73) Assignee: Lam Research Corporation, Fremont, CA (US)

(*) Notice: Subject to any disclaimer, the term of this patent is extended or adjusted under 35 U.S.C. 154(b) by 0 days.

(21) Appl. No.: 09/618,198

(22) Filed: Jul. 18, 2000

Related U.S. Application Data (60) Division of application No. 09/197,348, filed on Nov. 20, 1998, which is a continuation-in-part of application No. 09/162,709, filed on Sep. 29, 1998, now abandoned.

(51) Int. Cl.$^7$ .................................................. B08B 7/04
(52) U.S. Cl. .......................... 134/2; 134/22.19; 134/25.4; 134/26; 134/34; 134/36; 134/42; 134/902; 510/175; 15/22.1; 15/77; 15/88.3; 15/102
(58) Field of Search ............................. 510/175; 15/21.1, 15/77, 88.3, 102; 134/2, 22.19, 25.4, 26, 34, 36, 42, 902

(56) References Cited

U.S. PATENT DOCUMENTS

| | | | |
|---|---|---|---|
| 3,876,916 | 4/1975 | Stoakes | 317/249 R |
| 4,062,463 | 12/1977 | Hillman et al. | 214/301 |

(List continued on next page.)

FOREIGN PATENT DOCUMENTS

| | | |
|---|---|---|
| 3330099 A1 | 3/1985 | (DE) . |
| 440 918 A2 | 8/1991 | (EP) . |
| 527 100 A2 | 2/1993 | (EP) . |
| 386 207 B1 | 9/1994 | (EP) . |
| 614 213 B1 | 9/1994 | (EP) . |
| 690 482 A2 | 1/1996 | (EP) . |
| 693 186 B1 | 1/1996 | (EP) . |
| 700 077 A2 | 3/1996 | (EP) . |
| 726 599 A2 | 8/1996 | (EP) . |
| 731 495 A2 | 9/1996 | (EP) . |

(List continued on next page.)

OTHER PUBLICATIONS

Yang, Zhao, Neirynck, Muraka and Gutmann, "Chemical–Mechanical Polishing of Parylene N and Benzocyclobutene Films", 9–97, J. Electrochem. Soc., vol. 144, No. 9.

(List continued on next page.)

*Primary Examiner*—Sharidan Carrillo
(74) *Attorney, Agent, or Firm*—Martine & Penilla, LLP (57) ABSTRACT

Provided is a method for cleaning hydrophobic surfaces, such as low K dielectric organic or inorganic surfaces as well as metallization surfaces of a semiconductor wafer. The method includes: (a) applying a surfactant solution to the surface; (b) scrubbing the surface; and (c) spin-rinsing the surface of the substrate using de-ionized water to complete a removal of any contaminants from the surface. If needed, the surfactant solution can be mixed with a chemical enhancer, and the scrubbing can be performed in a brush system. The brush system may be configured to apply DI water using a through the brush (TTB) technique. The surfactant solution can be applied either using a drip technique or using the TTB technique.

10 Claims, 9 Drawing Sheets

U.S. PATENT DOCUMENTS

| | | | |
|---|---|---|---|
| 4,202,071 | 5/1980 | Scharpf | 15/302 |
| 4,382,308 | 5/1983 | Curcio | 15/77 |
| 4,895,972 | 1/1990 | Stoakley et al. | 528/353 |
| 4,902,350 | 2/1990 | Steck | 134/1 |
| 4,972,250 | 11/1990 | Omori et al. | 357/54 |
| 5,126,192 | 6/1992 | Chellis et al. | 428/328 |
| 5,129,955 | 7/1992 | Tanaka | 134/2 |
| 5,227,013 | 7/1993 | Kumar | 156/644 |
| 5,244,507 | 9/1993 | Rowe | 134/38 |
| 5,306,439 | 4/1994 | Lockhart | 252/174 |
| 5,317,778 | 6/1994 | Kudo et al. | 15/88.3 |
| 5,320,706 | 6/1994 | Blackwell | 156/636 |
| 5,324,690 | 6/1994 | Gelatos et al. | 437/236 |
| 5,357,645 | 10/1994 | Onodera | 15/97.1 |
| 5,361,449 | 11/1994 | Akimoto | 15/302 |
| 5,431,841 | 7/1995 | Lockhart | 252/90 |
| 5,478,436 | 12/1995 | Winebarger et al. | 156/636.1 |
| 5,486,134 | 1/1996 | Jones et al. | 451/209 |
| 5,490,809 | 2/1996 | Jones et al. | 451/60 |
| 5,494,859 | 2/1996 | Kapoor | 437/235 |
| 5,550,405 | 8/1996 | Cheung et al. | 257/642 |
| 5,556,812 | 9/1996 | Leuschner et al. | 437/209 |
| 5,578,562 | 11/1996 | Lockhart | 510/446 |
| 5,581,837 | 12/1996 | Uchiyama et al. | 15/77 |
| 5,585,450 | 12/1996 | Oaks et al. | 526/279 |
| 5,624,501 | 4/1997 | Gill, Jr. | 134/6 |
| 5,635,463 | 6/1997 | Muroaka | 510/175 |
| 5,651,160 | 7/1997 | Yonemizu et al. | 15/302 |
| 5,660,642 | 8/1997 | Britten | 134/30 |
| 5,665,168 | 9/1997 | Nakano et al. | 134/2 |
| 5,675,856 | 10/1997 | Itzkowitz | 15/77 |
| 5,679,608 | 10/1997 | Cheung et al. | 437/195 |
| 5,681,398 | 10/1997 | Muroaka | 134/3 |
| 5,693,148 | 12/1997 | Simmons et al. | 134/18 |
| 5,698,266 | 12/1997 | Floch et al. | 427/376.2 |
| 5,744,865 | 4/1998 | Jeng et al. | 257/750 |
| 5,762,084 | 6/1998 | Krusell et al. | 134/184 |
| 5,778,554 | 7/1998 | Jones | 34/58 |
| 5,798,559 | 8/1998 | Bothra et al. | 257/522 |
| 5,806,126 | 9/1998 | de Larios et al. | 15/102 |
| 5,875,507 | 3/1999 | Stephens et al. | 15/102 |
| 5,995,361 | 11/1999 | Jayaraj et al. | 361/511 |
| 5,996,594 | 12/1999 | Roy et al. | 134/1.3 |
| 6,007,638 | 12/1999 | Shinohara et al. | 134/2 |
| 6,152,148 * | 11/2000 | George et al. | 134/2 |
| 6,159,661 * | 12/2000 | Hoang et al. | 430/313 |

FOREIGN PATENT DOCUMENTS

| | | | |
|---|---|---|---|
| 742 282 A1 | 11/1996 | (EP) . | |
| 759 481 A1 | 2/1997 | (EP) . | |
| 537 627 B1 | 4/1997 | (EP) . | |
| 830 890 A1 | 3/1998 | (EP) . | |
| 61148938 | 9/1988 | (EP) | H01L/21/304 |
| 94/23315 | 10/1994 | (FR) . | |
| 2 722 511 | 7/1995 | (FR) | H01L/21/02 |
| 2313954 | 10/1997 | (GB) | H01L/21/316 |
| 59007949 | 1/1984 | (JP) . | |
| 61100937 | 5/1986 | (JP) . | |
| 62031127 | 2/1987 | (JP) . | |
| 63129624 | 6/1988 | (JP) . | |
| 63129627 | 6/1988 | (JP) . | |
| 63216356 | 9/1988 | (JP) . | |
| 63299246 | 12/1988 | (JP) . | |
| 01008630 | 1/1989 | (JP) . | |
| 01037841 | 2/1989 | (JP) . | |
| 01293622 | 11/1989 | (JP) . | |
| 02205322 | 8/1990 | (JP) . | |
| 02309637 | 12/1990 | (JP) . | |
| 03036809 | 2/1991 | (JP) . | |
| 05198545 | 1/1992 | (JP) . | |
| 04144132 | 5/1992 | (JP) . | |
| 04291722 | 10/1992 | (JP) . | |
| 04291723 | 10/1992 | (JP) . | |
| 04291724 | 10/1992 | (JP) . | |
| 04326902 | 11/1992 | (JP) . | |
| 05175184 | 7/1993 | (JP) . | |
| 05281755 | 10/1993 | (JP) . | |
| 05315311 | 11/1993 | (JP) . | |
| 05323580 | 12/1993 | (JP) . | |
| 05331386 | 12/1993 | (JP) . | |
| 06039375 | 2/1994 | (JP) . | |
| 06041770 | 2/1994 | (JP) . | |
| 06177101 | 6/1994 | (JP) . | |
| 06302574 | 10/1994 | (JP) . | |
| 07066101 | 3/1995 | (JP) . | |
| 07142436 | 6/1995 | (JP) . | |
| 95/20642 | 8/1995 | (JP) . | |
| 07263390 | 10/1995 | (JP) . | |
| 07283194 | 10/1995 | (JP) . | |
| 96/21942 | 7/1996 | (JP) . | |
| 09007981 | 1/1997 | (JP) . | |
| 09045640 | 2/1997 | (JP) . | |
| 09050978 | 2/1997 | (JP) . | |
| 09083021 | 3/1997 | (JP) . | |
| 97/18582 | 5/1997 | (JP) . | |
| 09223679 | 8/1997 | (JP) . | |
| 09260491 | 10/1997 | (JP) . | |
| 09266190 | 10/1997 | (JP) . | |
| 09286999 | 11/1997 | (JP) . | |
| 09302391 | 11/1997 | (JP) . | |
| 09330902 | 12/1997 | (JP) . | |
| 10079382 | 3/1998 | (JP) . | |
| 93/12055 | 6/1993 | (WO) . | |
| 96/19830 | 6/1996 | (WO) . | |
| 97/01593 | 1/1997 | (WO) . | |
| 97/02905 | 1/1997 | (WO) . | |
| 97/10193 | 3/1997 | (WO) . | |
| WO 99/22908 * | 5/1999 | (WO) . | |
| WO 97/13590 | 4/1997 | (WO) | B08B/1/00 |

OTHER PUBLICATIONS

Neirynck, Yang, Muraka and Gutmann, "The addition of surfactant to slurry for polymer CMP: effects on polymer surface, removal rate and underlying Cu", 1996, Thin Solid Films, pp. 447–452.

Hartmannsgruber, Kulawski, Zwicker and Beekman, "Chemical–Mechanical Polishing of Low–K CVD Oxide Films", Fraunhofer Institut Siliciumtechnologie, 6–98 VMIC Conf., 1998 IMIC.

Lagendijk, Treichel, Uram and Jones, "Low–Dielectric Constant Materials II", Materials Research Soc., Symposium Proceedings, vol. 443, pp. 176–183, 12–96 Symposium.

Lagendijk, Treichel, Uram and Jones, "Low–Dielectric Constant Materials II", Materials Research Soc., Symposium Proceedings, vol. 443, pp. 127–135, 12–96 Symposium.

Lagendijk, Treichel, Uram and Jones, "Low–Dielectric Constant Materials II", Materials Research Soc., Symposium Proccedings, vol. 443, pp. 99–105, 12–96 Symposium.

Lagendijk, Treichel, Uram and Jones, "Low–Dielectric Constant Materials II", Materials Research Soc., Symposium Proceedings, vol. 443, pp. 3–15, 12–96 Symposium.

Price, Gutmann and Murarka, "Damascene copper interconnects with polymer ILDs", 1997, Thin Solid Films, pp. 523–528.

Gutmann, Steigerwalk, You, Price, Neirynck, Duquette and Murarka, "Chemical–mechanical polishing of copper with oxide and polymer interlevel dielectrics", 1995, Thin Solid Films, pp. 596–600.

Wang, Liu, Feng, Dun and Chou, "Effects of underlying films on the chemical–mechanical polishing for shallow trench isolation technology," 1997, Thin Solid Films, pp. 543–549.

Wang, Liu, Chang, Tsai, Feng and Tseng, "Chemical–mechanical polishing of low–dielectric–constant spin–on glasses: film chemistries, slurry formulation and polish selectivity", 1997, Thin Solid Films, pp. 550–554.

S.C. Sun, "Process Technologies for Advanced Metallization and Interconnect Systems", 1997 IEEE, Taiwan Semiconductor Mfg. Co., Electron Devices Meeting 12–97, Washington, D.C.

F. Pintchovski, "Progression of Multilevel Metallization Beyond 0.35 micron Technology", 1994 IEEE, Motorola, Inc., Austin TX, Electron Devices Meeting, 12–94 San Francisco, CA.

K. Endo, "Fluorinated Amorphous Carbon as a Low–Dielectric–Constant Interlayer Dielectric", 10–97, MRS Bulletin, pp. 55–58.

Jin, Luttmer, Smith and Ramos, "Nanoporous Silica as an Ultralow–k Dielectric", 10–97, MRS Bulletin, pp. 39–42.

P. Singer, "Low k Dielectrics: The Search Continues", 5–96, Semiconductor International, pp. 88–96.

Murakami and Matsushita, "SiOF Films: The Problem in Logic Devices", 5–96, Semiconductor International.

Crescenzi, Marki and Kennedy, "Fused Silica: A Better Substrate for Mixers?", 1–76, Microwaves, pp. 34–41.

Kurihara, Horiuchi, Takeuchi and Wakabayashi, "Mullite Ceramic Substrate for Thin–Film Application", Shinko Electric Industries, Japan, May 1990, $40^{th}$ Electronic Components & Technology Conference, Las Vegas, NV.

Chandramouli, Maziar and Campbell, "Simulation of the Effect of Multiplication Layer Thickness in Wide–Bandwidth Avalanche Photodiodes", 11–93 IEEE Transactions on Electron Devices, vol. 40, No. 11.

A.W. Warner, "Technology of Thin Single–Crystal Transducers", Jan. 1969, IEEE Transactions on Sonics and Ultrasonics, vol. SU–16, No. 1.

Endo, Tatsumi, Matsubara and Horiuchi, "Application of Fluorinated Amorphous Carbon Thin Films for Low Dielectric Constant Interlayer Dielectrics", 1998, Jpn. J. Appl. Phys. vol. 37, No. 4A.

Tu, Mayer, Poate and Chen, "Advanced Metallization for Future ULSI", 4–96, Materials Research Soc. Symposium Proc., vol. 427, pp. 441–447.

P. Felix, "Interconnects for ULSI: State of the Art and Future Trends", 9–95, ESSDERC's 95, Device Research Conf., Netherlands.

Lu, Murarka, Kuan and Ting, "Low–Dielectric Constant Materials–Synthesis and Applications in Microelectronics", Materials Research Soc. Symp. Proceedings, vol. 381, 4–95, Symposium in San Francisco, CA.

Nemanich, Helms, Hirose and Rubloff, "Chemical Surface Preparation, Passivation and Cleaning for Semiconductor Growth and Processing", Materials Research Soc. Symp. Proceedings, vol. 259, 4–92, Symposium in San Francisco, CA.

Ali and Raghavan, "Chemical Mechanical Planarization", 2–98, Electrochemical Society, vol. 96–22, pp. 46–59.

Jackson, Pohanka, Uhlmann and Ulrich, "Electronic Packaging Materials Science II", Materials Research Society, 4–86, vol. 72, Symposium in Palo Alto, CA.

Lagendijk, Treichel, Uram and Jones, "Low–Dielectric Constant Materials II", Materials Research Society, 12–96, vol. 443, Symposium in Boston, MA.

Ccch, Oprysko, Young and Li, "Photoimageable polyimide: a dielectric material for high aspect ratio structures", 1986, Advances in Resist Technology & Proc. III, SPIE vol. 631, pp. 202–205.

Chooi, Ang, Zheng and Chan, "A comparison of spin–on materials in IMD planarization", SPIE vol. 2875, pp. 275–284, Dept. of Research & Development, Singapore.

Tseng, Hseih and Lin, "CMP of fluorinated silicon dioxide: Is it necessary and feasible?", 2–97, Solid State Technology, pp. 61–66.

Paik and Mogro–Campero, "Studies the High Temperature Superconductor (HTS)/Metal/Polymer Dielectric Interconnect Structure for Packaging Applications", IEEE 5–94, $44^{th}$ Electronic Components & Tech. Conf., Washington, D.C.

D. Hager and E. Buck, "High Band Traveling Wave Tube Production Program", Jun. 1989, $3^{rd}$ International SAMPE Electronics Conf., vol. 3, Los Angeles, CA.

C. Kim, K. Kim, J. Lee, K. Han and C. Park, "Growth and Analysis of $CeO_2$ Thin Films on Si(III) Substrate Prepared by Electron Beam Evaporation", Jan. 1998, pp. 64–70, Journal of Korean Phys. Soc., vol. 32, No. 1.

* cited by examiner

METHOD AND APPARATUS FOR CLEANING LOW K DIELECTRIC AND METAL WAFER SURFACES

CROSS-REFERENCE TO RELATED APPLICATIONS

This is a divisional application of prior application Ser. No. 09/197,348 filed on Nov. 20, 1998. which is a continuation-in-part of pending U.S. patent application Ser. No. 09/162,709 now abandoned filed on Sep. 29, 1998, entitled "Method and Apparatus for Cleaning Low-K Dielectric and Metal Wafer Surfaces," and naming Linda (Tong) Jiang and Diane J. Hymes as inventors. The contents of this pending application are incorporated herein by reference for all purposes.

BACKGROUND OF THE INVENTION

1. Field of the Invention

The present invention relates generally to the cleaning of semiconductor wafers, and, more particularly, to techniques for cleaning wafers having hydrophobic low k dielectric and metal surfaces.

2. Description of the Related Art

Integrated circuits utilize dielectric layers to insulate conductive lines on various layers of a semiconductor structure. However, as circuits become faster and more compact, the distances between the conductive lines decrease, which necessarily introduces increased coupling capacitance. Therefore, it has become increasingly important to have a dielectric layer that is able to better insulate conductive lines against the increasing coupling capacitance levels, which have the drawback of slowing the operation of the semiconductor device.

Figure 1A:
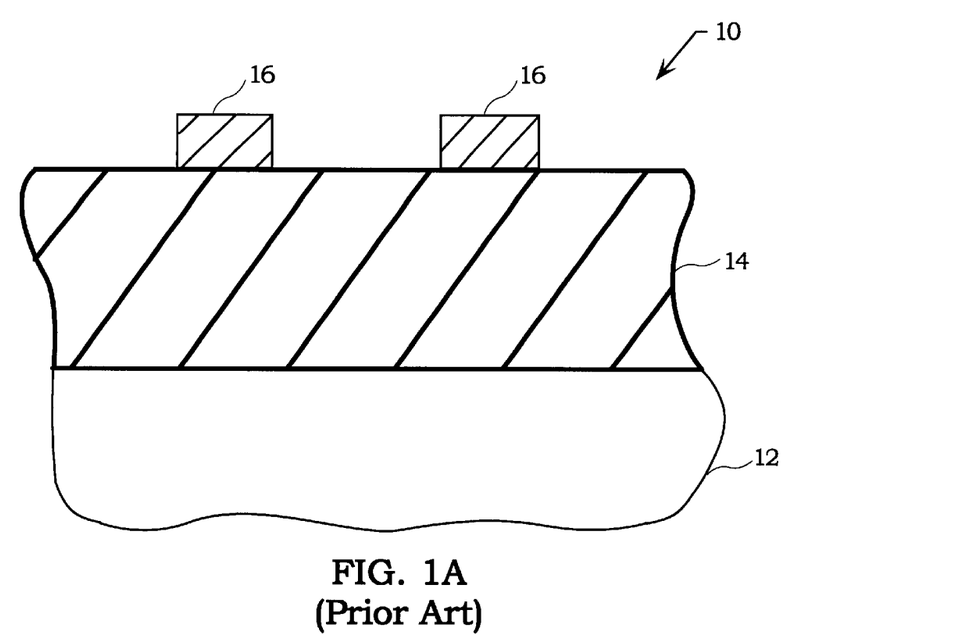
FIG. 1A is a cross-sectional view illustrating several layers of a typical prior art integrated circuit.

FIG. 1A is a cross-sectional view illustrating several layers of a typical prior art integrated circuit 10. The integrated circuit 10 includes a substrate 12 that supports an oxide dielectric layer 14, which is typically silicon dioxide ($SiO_2$). A metal layer typically made of aluminum (Al) is deposited onto the oxide dielectric layer 14 and etched into a plurality of metal lines 16. For ease of illustration, only two metal lines 16 are shown, but as is well known in the art, many additional metal lines 16 are used to provide the necessary interconnections of a layer of an integrated circuit device.

Generally, the coupling capacitance in an integrated circuit is directly proportional to the dielectric constant (K) of the dielectric material used. The oxide dielectric layer 14, which is typically made from silicon dioxide, has a dielectric constant of about 4.0. Because line densities and operating frequencies in semiconductor devices are constantly increasing, the coupling capacitances between conductive lines have increased to the point that the oxide dielectric layer 14 having a dielectric constant of about 4.0 is a less than adequate insulator.

Figure 1B:
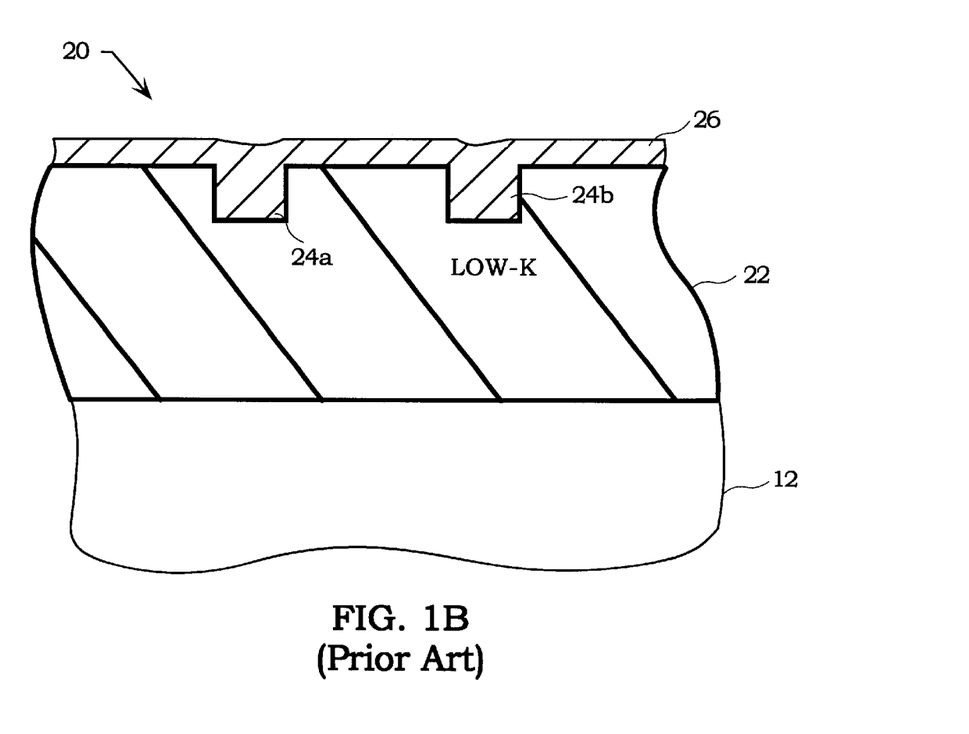
FIG. 1B is a cross-sectional view illustrating several layers of another type of prior art integrated circuit incorporating an organic dielectric layer.

FIG. 1B is a cross-sectional view illustrating several layers of another type of prior art integrated circuit 20 incorporating an organic dielectric layer 22. The organic dielectric layer 22 typically has a dielectric constant of between about 1.5 and about 3.5. Thus, the organic dielectric layer 22 is much less conductive than the oxide dielectric layer 14 and better able to isolate conductive lines and reduce the coupling capacitances. After the organic dielectric layer 22 is formed over the substrate 12, a plurality of trenches 24 is etched into the organic dielectric layer 22. Then, the trenches 24 are filled by depositing a copper (Cu) layer 26 (or aluminum) over the organic dielectric layer 22.

Figure 1C:
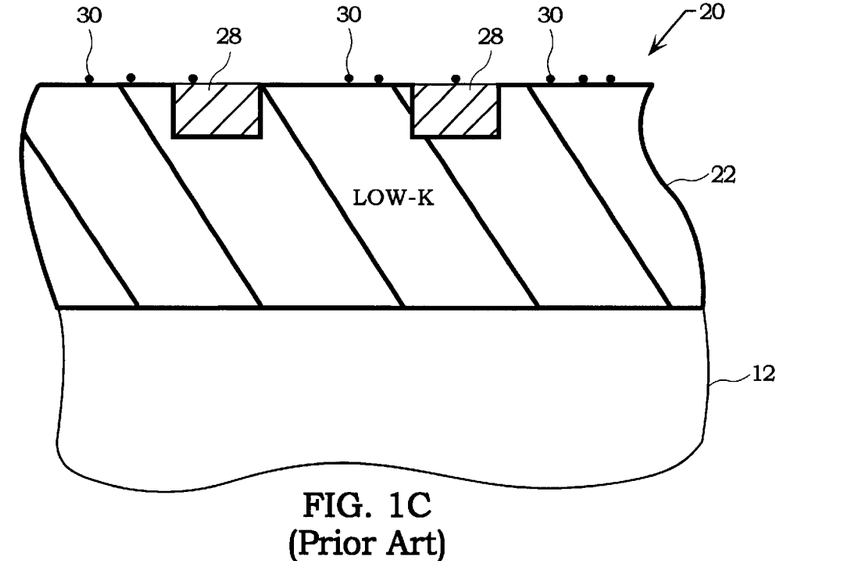
FIG. 1C illustrates the integrated circuit of FIG. 1B after a conventional CMP operation is performed.

FIG. 1C illustrates the integrated circuit 20 of FIG. 1B after a conventional chemical mechanical polishing (CMP) operation is performed. The CMP process planarizes the top surface of the copper layer 20 down to the organic dielectric layer 22 and the resulting copper lines 28. However, the CMP process leaves behind a film of particles and metal contaminants ("contaminants") 30 on the surface of the dielectric layer 22 and the copper lines 28. As is well known in the art, copper has a lower resistance than the aluminum used in the integrated circuit 10 of FIG. 1A. However, copper is also known to be more susceptible to corrosion than aluminum, which makes it even more important to clean contaminants 30 from its surface.

Figure 1D:
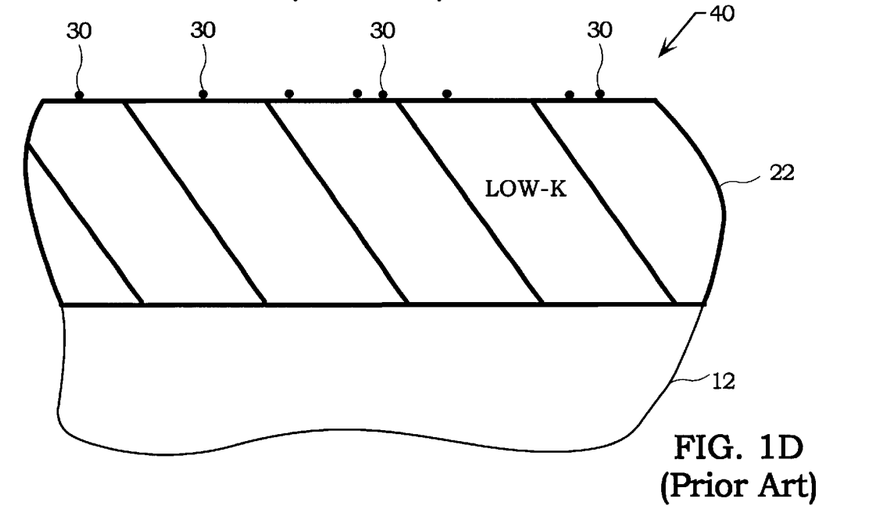
FIG. 1D illustrates another partial view of a prior art semiconductor device where the organic dielectric layer is spun on or deposited by CVD.
Figure 1E:
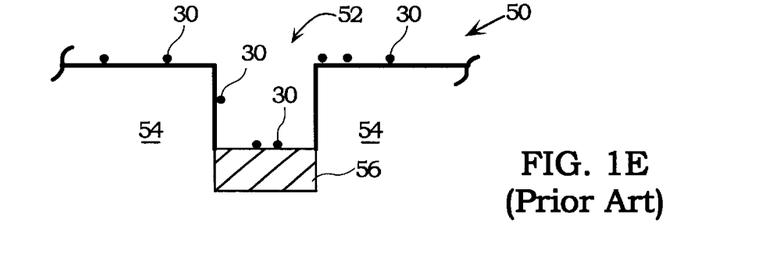
FIG. 1E illustrates another partial view of a prior art semiconductor device after a via hole is etched through a dielectric layer down to a metal line.

FIG. 1D illustrates another partial view of a prior art semiconductor device 40 where the organic dielectric layer 22 is spun on or deposited by chemical vapor deposition (CVD). FIG. 1E illustrates another partial view of a prior art semiconductor device 50 after a via hole 52 is etched through a dielectric layer 54 down to a metal line 56. In both the semiconductor devices 40 and 50, the spin-on/deposition and via hole etch leave behind a film of contaminants 30.

In the integrated circuit 10 of FIG. 1A, any particles were capable of being cleaned by simply, e.g., spraying the surface of the oxide dielectric layer 14 with aqueous solutions such as de-ionized water, or de-ionized water and acid/base. As is well known, cleaning the particles from the surface of silicon dioxide type dielectrics is rather straight forward because this kind of material is substantially hydrophilic. That is, when cleaning fluids are applied to the surface of a hydrophilic material, the fluids will actually wet over the surface. To further facilitate cleaning, some cleaning processes implement a special polyvinyl alcohol (PVA) brush (i.e., a very soft sponge) to assist in dislodging the particles, using de-ionized water and/or acid/base. The particles would then be removed from the surface of the silicon oxide dielectric layer when rinsed off.

Unfortunately, this conventional method of cleaning the semiconductor wafer does not work for semiconductor devices that incorporate low K dielectric polymers and/or organic dielectric materials, such as the organic dielectric layer 22. Organic dielectric materials are hydrophobic, therefore, the cleaning fluids are repelled from the surface of the organic materials. As is well known, a contact angle may be measured from a droplet of water that is in direct contact with a given material to determine the degree of repulsion.

In addition, organic dielectric materials are chemically inert, which prevent them from reacting with chemical reagents to convert hydrophobic surfaces into hydrophilic surfaces while leaving the bulk materials intact. Because standard cleaning fluids fail to achieve sufficient contact with the hydrophobic organic dielectric materials, scrubbing the semiconductor wafer with a brush would only draw more particles to the surface of the wafer. Therefore, using scrubbing techniques over hydrophobic organic surfaces will only exacerbate the particle contamination problem. As is well known, some hydrophobic organic surfaces can be cleaned using organic solvents. However, such organic solvents are often highly toxic and more expensive than water. Further yet, when the toxic organic solvents are used, more complex equipment is required to perform the cleaning processes. The brush material, PVA, is, in general, not compatible with organic solvents. As a result, cleaning using organic solvents is highly undesirable.

In view of the foregoing, it is desirable to have an apparatus and method of cleaning particles and/or metal contaminants from hydrophobic organic dielectric layers using aqueous solutions without damaging the integrated circuit surface.

SUMMARY OF THE INVENTION

The present invention fills these needs by providing an efficient and economical method and apparatus for cleaning low K dielectric polymer surfaces (organic and inorganic) and metallization surfaces of a wafer without damaging the integrated circuit device surface. It should be appreciated that the present invention can be implemented in numerous ways, including as a process, an apparatus, a system, a device or a method. Several inventive embodiments of the present invention are described below.

In one embodiment of the present invention a method for cleaning a low K dielectric film surface of a semiconductor substrate is disclosed. The method includes applying de-ionized water and a surfactant formulation solution to the low K dielectric polymer surface to form a wettable conditioning layer. The wettable conditioning layer is configured to commence the cleaning that is targeted to remove particle and/or metal contaminants throughout the low K dielectric polymer surface. To continue the cleaning, de-ionized water and a surfactant solution are applied over the low K dielectric polymer surface. The semiconductor substrate then is spin-rinsed to remove any applied surfactant formulation solution or surfactant solution while removing the remaining particle contaminants and/or metal contaminants from over the low dielectric polymer surface.

In another embodiment of the present invention an alternative method for cleaning a low K dielectric film surface of a semiconductor wafer is disclosed. The method includes applying a first mixture of de-ionized water and a surfactant formulation solution to the organic dielectric surface, and then scrubbing the organic dielectric surface. A second mixture of de-ionized water and a surfactant solution is then applied to the dielectric surface, and subsequently scrubbed to continue the cleaning. The substrate is then spin-rinsed using de-ionized water to complete a removal of any contaminants from the organic dielectric surface.

In yet another embodiment of the present invention, an apparatus for cleaning an organic dielectric surface of a semiconductor wafer is disclosed. The apparatus includes a first cleaning stage for applying a first mixture of de-ionized water and a surfactant formulation solution to the dielectric surface. The first cleaning stage incorporates a first brush system for scrubbing the dielectric surface using the first mixture. The apparatus includes a second cleaning stage for applying a second mixture of de-ionized water and a surfactant solution to the dielectric surface. The second cleaning stage incorporates a second brush system for scrubbing the organic surface using the second mixture. After the second cleaning stage is complete, a spin-rinsing bowl is used for rinsing the wafer using de-ionized water to complete a removal of any contaminants from the dielectric surface.

Still further, in another embodiment, a method for cleaning a surface of a semiconductor substrate is disclosed. In this embodiment, the surface can be one an low K dielectric, an inorganic low K dielectric, an aluminum metallization, or any combination thereof. Therefore, in this embodiment, the method includes applying de-ionized water and a surfactant formulation solution to the surface to form a wettable conditioning layer. The applying is configured to commence the cleaning that is targeted to remove particle contaminants and metal contaminants throughout the surface. The method then proceeds to applying de-ionized water and a surfactant solution over the surface to continue the cleaning. In a modification of this embodiment, the surfactant solution can be converted into a surfactant formulation solution by simply adding a chemical enhancer. Next, the method will move to spin-rinsing the semiconductor substrate to remove any applied surfactant formulation solution or surfactant solution while removing any remaining particle contaminants and/or metal contaminants from over the surface.

In still another embodiment, the method for cleaning a surface of a hydrophobic substrate of a semiconductor wafer is disclosed. The method includes: (a) applying a surfactant solution to the surface; (c) scrubbing the surface; and (c) spin-rinsing the surface of the substrate using de-ionized water to complete a removal of any contaminants from the surface. If needed, the surfactant solution can be mixed with a chemical enhancer, and the scrubbing can be performed in a brush system. The brush system is thus configured to apply DI water using a through the brush (TTB) technique. In this embodiment, the surfactant solution can be applied either using a drip technique or even using the TTB technique.

An advantage of the present invention is that it provides for the temporary wetting of hydrophobic surfaces to achieve excellent cleanability. More specifically, the present invention allows the cleaning of the many types of hydrophobic dielectric materials in semiconductor wafers including low K dielectric polymers, organic materials, inorganic materials, and conductive materials (i.e., metals).

Because semiconductor manufacturing is a very precise art, maintaining clean surfaces in all phases of fabrication is extremely important. Hydrophobic dielectric layers are known to accumulate a large amount of microscopic particles and/or metal contaminants during and after processes such as chemical vapor deposition (CVD), via hole etching, and chemical mechanical polishing (CMP). Therefore, it is extremely important to remove the particle contaminants, not only to fabricate a semiconductor device that conforms to its intended specifications. Furthermore, the embodiments of the present invention also enable, among other suitable techniques, the use of scrubber-based cleaning technologies to hydrophobic low K film cleaning.

Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings. To facilitate this description, like reference numerals designate like structural elements.

DETAILED DESCRIPTION OF THE PREFERRED EMBODIMENTS

A method and apparatus for cleaning low K dielectric materials and metallization materials on wafers is disclosed. In the following description, numerous specific details are set forth in order to provide a thorough understanding of the present invention. It will be understood, however, to one skilled in the art, that the present invention may be practiced without some or all of these specific details. In other instances, well known process operations have not been described in detail in order not to unnecessarily obscure the present invention.

Figure 2A:
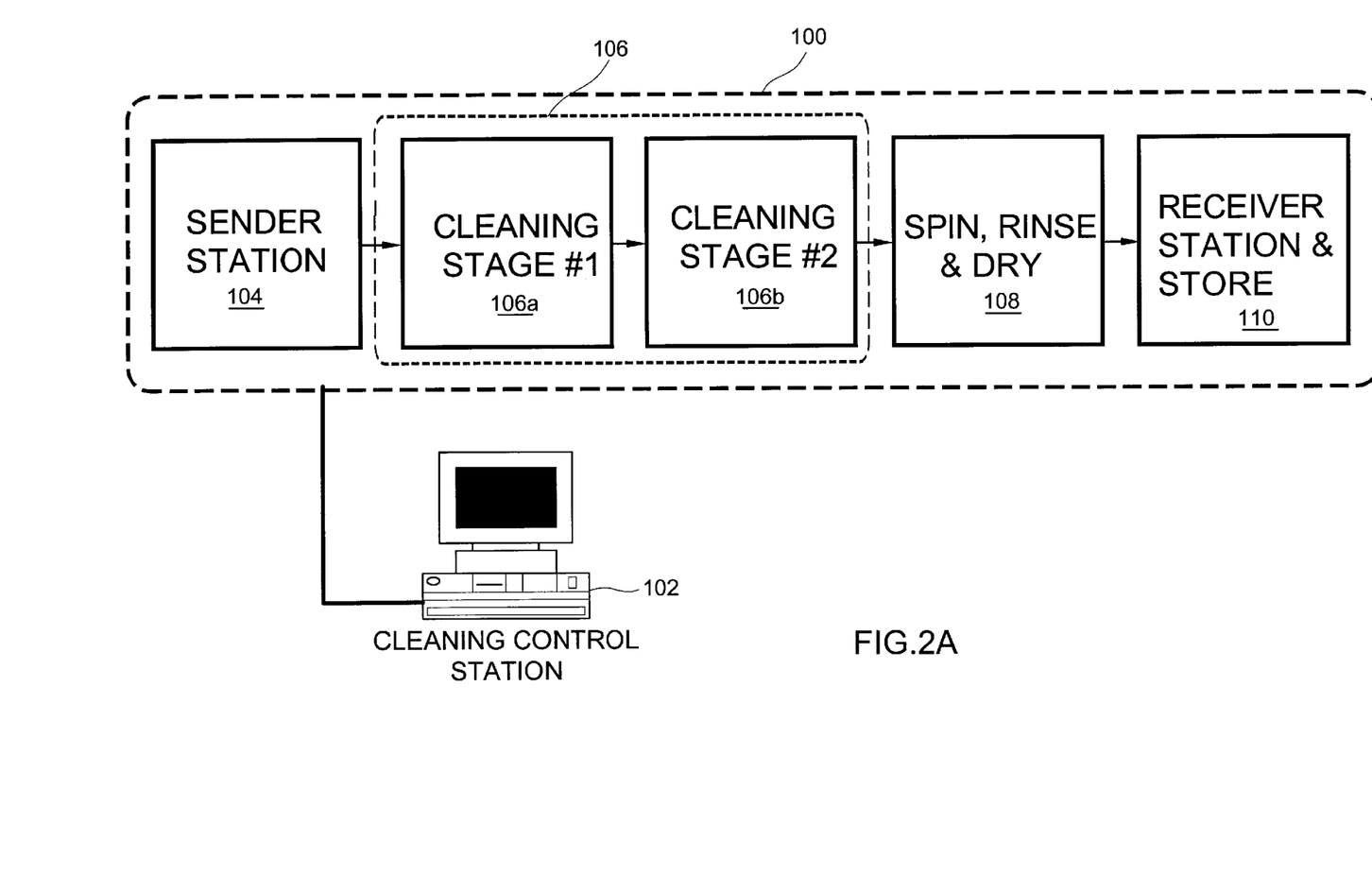
FIG. 2A shows a wafer cleaning station of the present invention that may be controlled in an automated way by a cleaning control station.

FIG. 2A shows a wafer cleaning station 100 of the present invention that may be controlled in an automated way by a cleaning control station 102. The wafer cleaning station 100 includes a sender station 104, a cleaning stage 106, a spin-rinse and dry (SRD) station 108, and a receiver station 110. As will be described below, the cleaning techniques of the present invention are advantageously run at room temperature, which greatly simplifies the equipment of the cleaning station 100.

As a broad overview of the cleaning process, contaminated semiconductor wafers are initially placed into the sender station 104. The sender station 104 then delivers a wafer (one-at-a-time) to the cleaning stage 106 where a low K dielectric hydrophobic surface of the wafer is conditioned to enable particles and/or metal contaminants to be efficiently removed from the surface.

In one embodiment, the cleaning stage 106 is preferably divided into a first cleaning stage 106a and a second cleaning stage 106b, although having just one cleaning stage 106 may also work. Having two cleaning stages 106a and 106b allows the wafer cleaning station 100 to apply two types of cleaning/conditioning solutions to the wafer. Preferably, during a cleaning cycle, each wafer spends between about 30 seconds and about 45 seconds, and more preferably about 35 seconds in each cleaning stage 106a and 106b. After passing through the cleaning stage 106, the wafer is passed through an exit spray in order to remove the cleaning/conditioning solutions and any contaminants. The spin-rinse is performed to enable the final cleaning of leftover particle contaminants and cleaning/conditioning solution. Then the SRD station 108 dries the wafer. Finally, the wafer is delivered to the receiver station 110 to be stored.

Figure 2B:
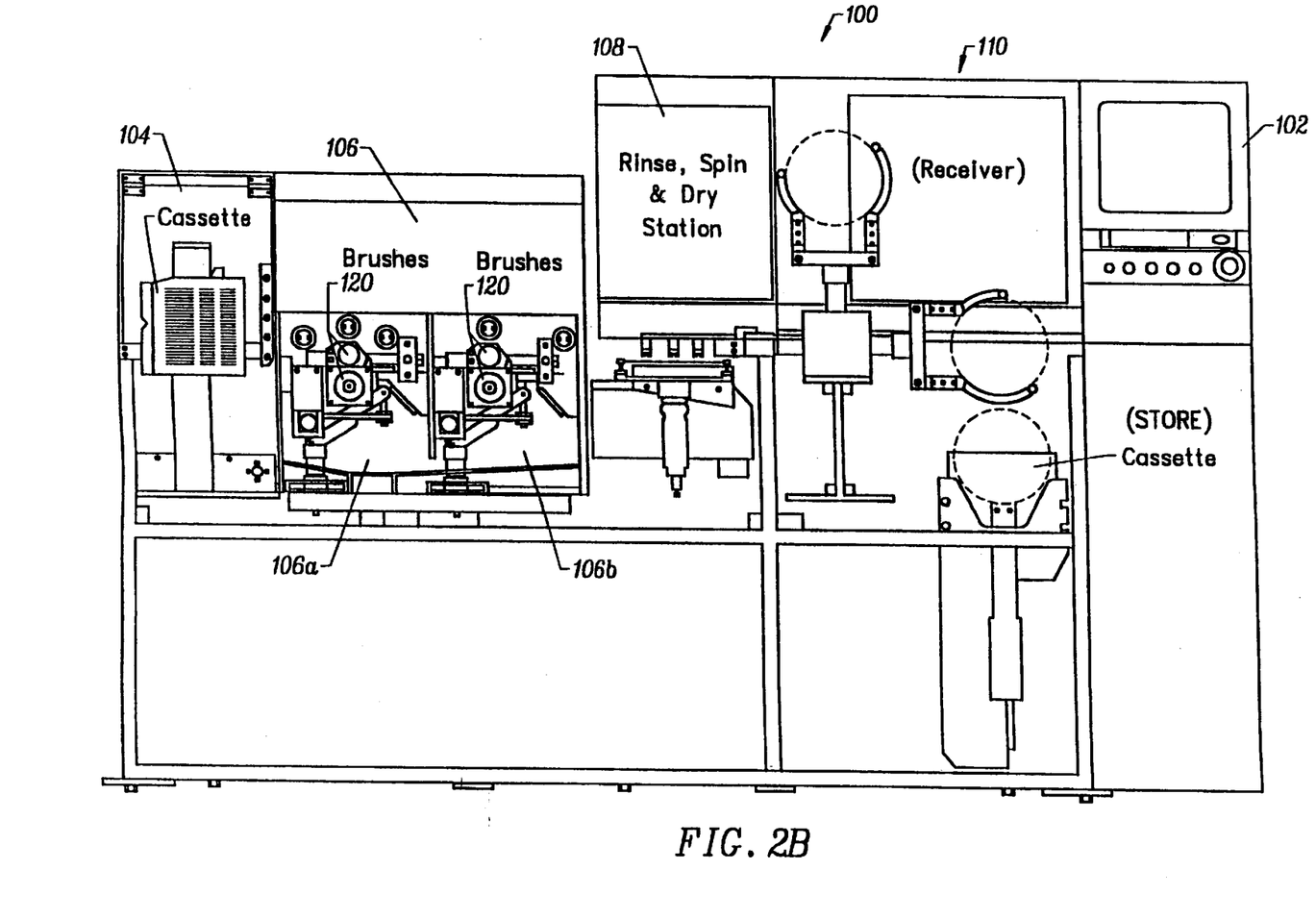
FIG. 2B shows a more detailed schematic of the exemplary wafer cleaning station.

FIG. 2B shows a more detailed schematic of the exemplary wafer cleaning station 100. Both the sender station 104 and the receiving station 110 are preferably adapted to receive a cassette containing a number of wafers. The first and second cleaning stages 106a and 106b preferably include a set of PVA brushes 120 that are very soft and porous. Therefore, the brushes 120 are capable of scrubbing the wafer clean without damaging the delicate surface.

Because the brushes 120 are porous, they are also able to function as a conduit for fluids that are to be applied to the wafer surface. For more information on wafer cleaning systems and techniques, reference may be made to commonly owned U.S. patent application Ser. Nos. (1) 08/792,093, filed Jan. 31, 1997, entitled "Method And Apparatus For Cleaning Of Semiconductor Substrates Using Standard Clean 1 (SC1)," and (2) 08/542,531, filed Oct. 13, 1995, entitled "Method and Apparatus for Chemical Delivery Through the Brush." Both U.S. patent applications are hereby incorporated by reference.

Figure 2C:
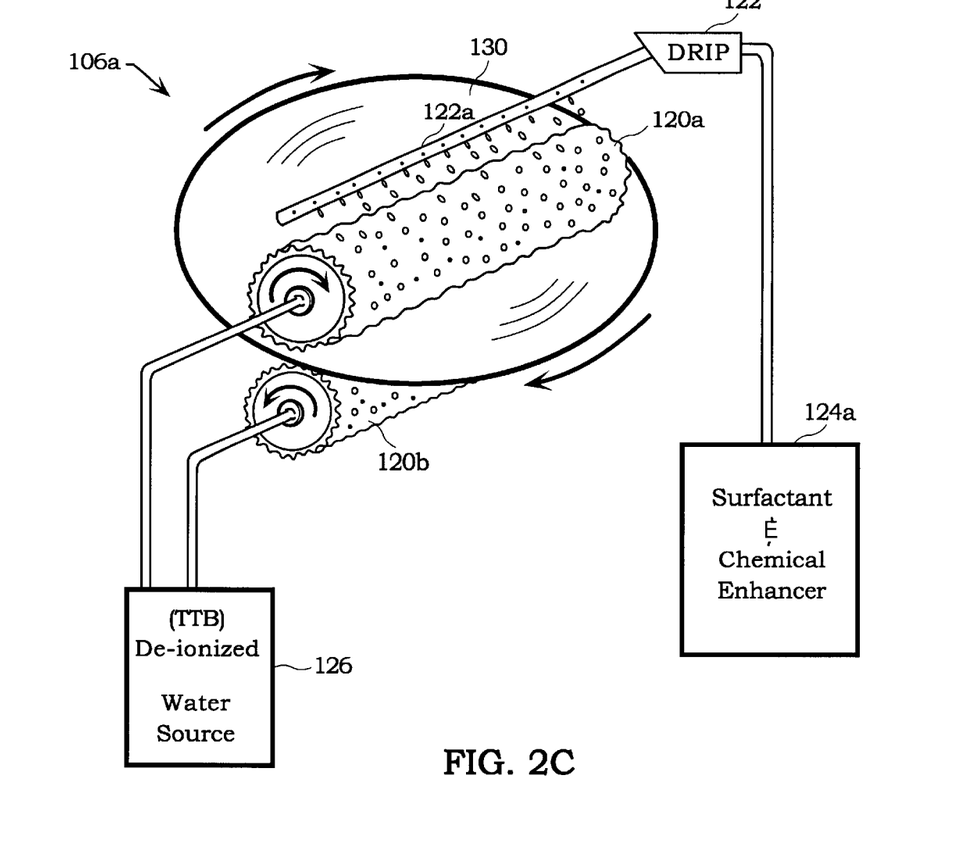
FIG. 2C shows a detailed view of the cleaning process preformed in the first cleaning stage in accordance with one embodiment of the present invention.

FIG. 2C shows a detailed view of the cleaning process performed in the first cleaning stage 106a in accordance with one embodiment of the present invention. In the first cleaning stage 106a, a wafer 130 is inserted between a top brush 120a and a bottom brush 120b. The wafer 130 is capable of being rotated to enable the brushes 120a and 120b to adequately clean the entire surface of the wafer 130. In certain circumstances, the bottom surface of the wafer is required to be cleaned as well, because the contaminants from the bottom may migrate to the top surface. Although both the top surface and the bottom surfaces of the wafer are scrubbed with the brushes 120, the top surface that is scrubbed with the top brush 120a is the primary surface targeted for cleaning, since the top surface is where the integrated circuit devices are being fabricated.

During cleaning, a water source 126 is configured to supply de-ionized (DI) water through the brush (TTB) for both brushes 120a and 120b, using a flow of about 200 to about 1000 mL/minute, and more preferably about 500 mL/minute onto the wafer 130. A drip chemical applicator 122 is positioned above the top brush 120a to allow an application arm 122a to drip a surface active reagent (surfactant) formulation solution 124a onto the top brush 120a. The surfactant formulation solution 124a is preferably dripped at a flow rate of about 150 to about 250 mL/minute. In an alternative embodiment, the chemicals can also be delivered through the brush (TTB) as opposed to drip delivery.

Figure 2D:
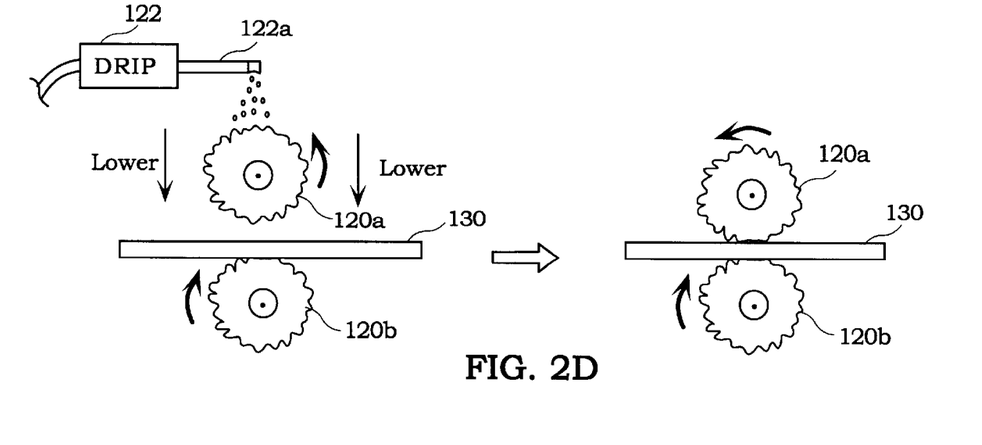
FIG. 2D shows the chemical application technique used in both the first cleaning stage and the second cleaning stage.

FIG. 2D shows the chemical application technique used in both the first cleaning stage 106a and the second cleaning stage 106b. In the first cleaning stage 106a, after the surfactant formulation solution 124a is dripped onto the top brush 120a, it mixes with the de-ionized water provided by the water source 126. The top brush 120a is then lowered onto the wafer 130 to scrub and clean the wafer 130. The cleaning solution is therefore made of a combination of the drip applied surfactant formulation solution 124a and the de-ionized water applied TTB as a cleaning solution.

The surfactant formulation solution 124a preferably includes surfactant and a chemical enhancer such as citric acid having the chemical formula identified in table A. Other organic acids, such as malic and acetic acids should also work well. Alternatively, the chemical enhancer may also be bases, such as a base ammonia (NH$_4$OH), or a mixture of citric and ammonia. Other alternative examples for the base ammonia chemical enhancer include, for example, an organic base such as an alkylammonium hydroxide. Examples of the alkylammonium hydroxide may include a tetramethylammonium hydroxide and a tetrabutylammonium hydroxide.

TABLE A

In one embodiment, the chemical enhancer is used to control an electric charge, also referred to as a zeta potential, of the top brush 120a, the hydrophobic surface of the wafer 130, and the particle contaminants. Controlling the electric charge is needed so that the same electric charge sign (positive or negative) is on the brush, wafer surface and the particles. In general, if the chemical enhancer is an acid, there is a decrease in the pH and an increase in the zeta potential. If the chemical enhancer is a base, there is an increase in the pH and an decrease in the zeta potential. The charge aids in cleaning the wafer 130 by further repelling particle contaminants away from the surface of the wafer 130. The charge also keeps the top brush 120a clean by repelling the particle contaminants away from the brush 120a, and preventing brush loading (i.e., accumulation of contaminants in the brush). A mixture of citric and ammonia is used to control both zeta-potential and pH.

The surfactant is preferably a non-ionic or an anionic surfactant, and most preferably includes aromatic rings (for organic low K dielectric applications). Furthermore the chosen surfactant chemical should be capable of being easily rinsed off from the wafer surface at the end of cleaning. One example company that produces surfactants having these qualities is Valtech Corporation, of Pughtown Penn. Valtech's product identifiers for the surfactants are, for example, SP 2275 and DP 93001. Preferably, the surfactant, in one embodiment, should have a concentration of about 0.1% to about 1% by volume of the surfactant formulation solution 124a (which includes both the surfactant and the chemical enhancer).

In the concentrations described herein, it is assumed that the concentration of the surfactant solution obtained from Valtech is 100% by volume, however, many suppliers may provide surfactant solutions with different concentrations. To achieve the preferred concentrations therefore, different diluting with de-ionized water may be performed.

If citric acid is used as the chemical enhancer, the citric acid should preferably have a concentration of about 0.1% to about 5% by weight of the surfactant formulation solution 124a. If ammonia is used, it should preferably have a concentration of about 0.02% to about 5% by weight of the surfactant formulation solution 124a. Thus, the surfactant formulation solution 124a is pre-mixed with DI water to achieve the desired concentration levels. Before the wafer 130 is moved out of the first cleaning stage 106, it is lightly rinsed with DI water through the brush (TTB) to remove the surfactant formulation solution and/or particle and metal contaminants.

Figure 2E:
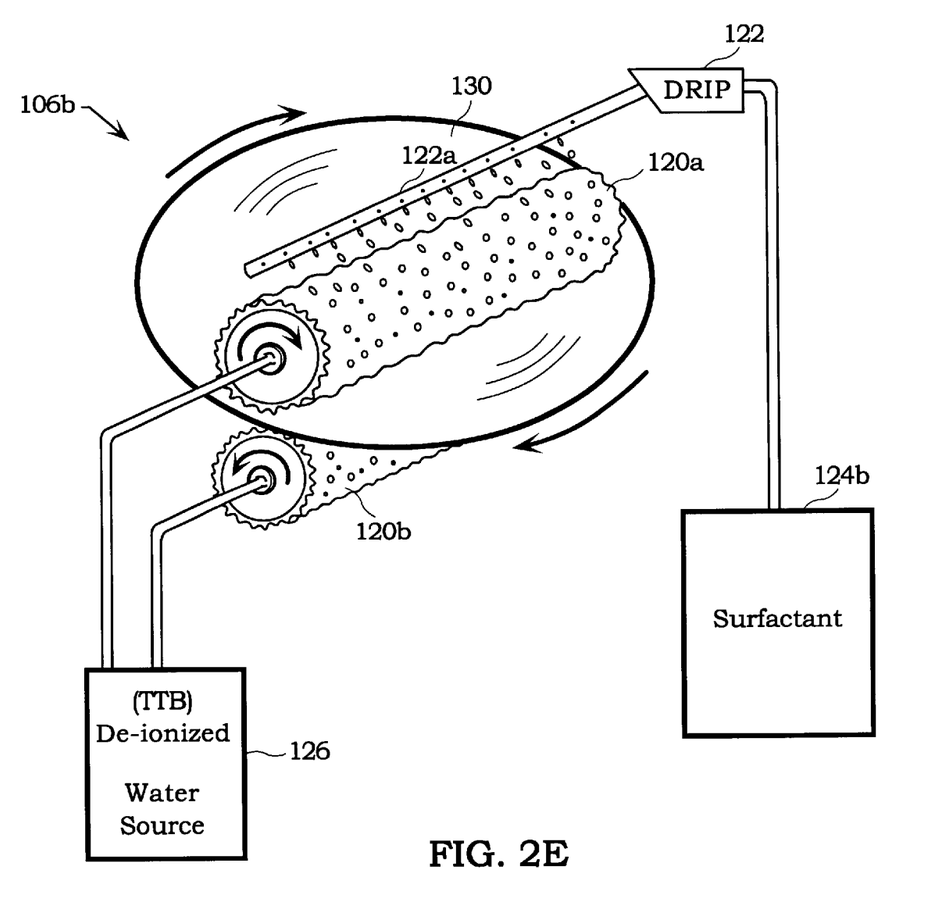
FIG. 2E shows a detailed view of the cleaning process performed in the second cleaning stage in accordance with one embodiment of the present invention.

FIG. 2E shows a detailed view of the cleaning process performed in the second cleaning stage 106b in accordance with one embodiment of the present invention. After the wafer 130 has been through the first cleaning stage 106a, it is transferred to the second cleaning stage 106b. The wafer 130 is again inserted between a top brush 120a and a bottom brush 120b. The wafer 130 is capable of being rotated to enable the brushes 120a and 120b to clean the entire surface of the wafer 130. A water source 126 is also capable of supplying DI water through the brush (TTB) to both brushes 120a and 120b.

A drip chemical applicator 122 is positioned above the top brush 120a to allow an application arm 122a to drip a surfactant solution 124b onto the top brush 120a and the wafer 130. Unlike the surfactant formulation solution 124a, the surfactant solution 124b preferably contains a concentration of about 0.1% to about 1% by volume surfactant, without any chemical enhancers. The top brush 120a is then lowered onto the wafer 130 to scrub and clean the wafer 130 using the combination of the surfactant solution 124b and the de-ionized water as shown in FIG. 2D. As applied in the first cleaning stage 106a, the de-ionized water is preferably applied using a flow of about 200 to about 1000 mL/minute, and more preferably about 500 mL/minute.

Alternatively, if the first cleaning stage 106a was not as successful as desired in cleaning the contaminants from the surface of the wafer, the second cleaning stage 106b can also be configured to apply the chemical enhancer. If the chemical enhancer is added in the second cleaning stage 106b, the surfactant solution 124b (of FIG. 2E) would essentially be replaced with the surfactant formulation solution 124a (of FIG. 2C). Further yet, if the first cleaning stage 106a performs an adequate cleaning job on the material being cleaned, there may not be a need for the second cleaning stage 106b.

As still a further alternative, the cleaning of some types of surfaces may not even require the application of the chemical enhancer in either the first stage or the second stage. In such cases, both the first stage and the second stage will only apply the surfactant solution. When this is the case, there may not even be a need to two separate stages, and a single surfactant solution application stage will be implemented.

Figure 3A:
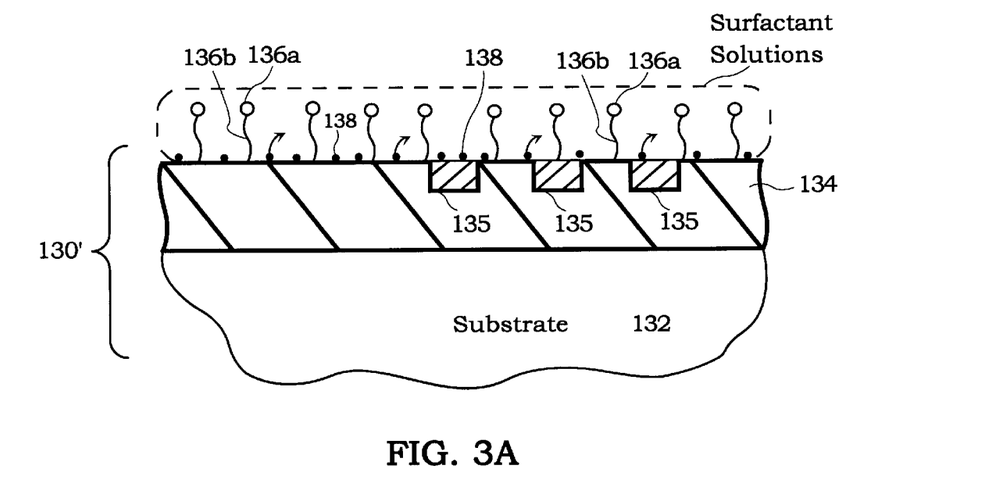
FIG. 3A shows a more detailed cross sectional view of a contaminated semiconductor wafer beginning the cleaning with surfactant solutions in accordance with one embodiment of the present invention.

FIG. 3A shows a more detailed cross sectional view of a contaminated semiconductor wafer 130' beginning the cleaning with surfactant solutions in accordance with one embodiment of the present invention. The wafer 130' includes a substrate 132 with a low K dielectric polymer layer 134 formed over the substrate 132. The low K dielectric polymer layer 134 (e.g. an organic type material) is much less conductive than layers made from silicon dioxide. The low K dielectric polymer layer 134 typically has dielectric constant values ranging between about 1.5 and about 3.5.

Unfortunately, while the low K dielectric polymer layer 134 is a much better insulator than the silicon dioxide dielectric materials, and greatly reduces the coupling capacitance between metal lines 135, it is much harder to clean and remove particles and/or metal contaminants 138 from the surface of the low K dielectric polymer layer 134 because it is hydrophobic. As is well known in the art, a contact angle between a drop of water and the surface of a material can be measured to determine whether the material is hydrophobic or hydrophilic. Typically, a contact angle of about 20° or above generally indicates that the material is hydrophobic. Consequently, conventional water and other aqueous cleaning fluids are unable to wet the surface and rinse away particle contaminants 138 because they are repelled and bead on the surface of the low dielectric polymer layer 134.

Figure 3B:
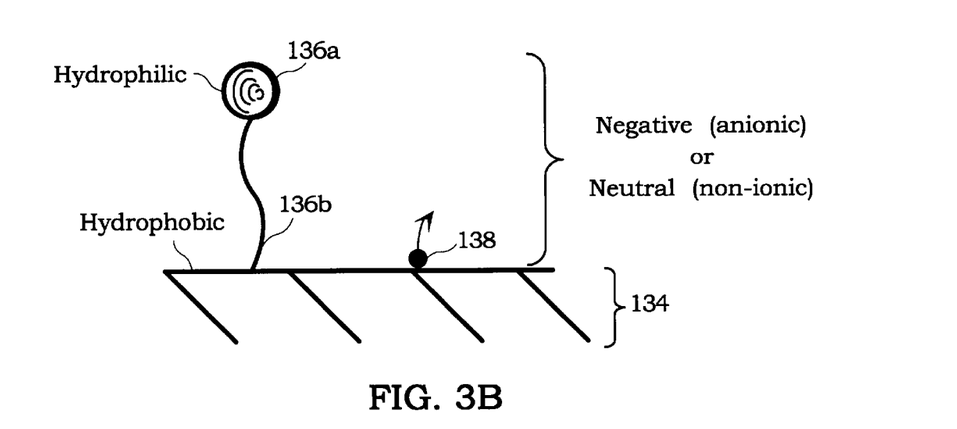
FIG. 3B is a more detailed view of the contaminated surface of the low K dielectric polymer layer.

As described above, the cleaning process of the present invention includes the use of cleaning solutions that contain surfactant. Surfactant molecules 136 are amphiphilic, containing both hydrophobic and hydrophilic groups (e.g., a hydrophilic group 136*a* and a hydrophobic group 136*b*). Thus, the hydrophobic group 136*b* of the surfactant molecule 136 is attracted to a hydrophobic surface. FIG. 3B is a schematic representation of a surfactant molecule over the contaminated surface of the low K dielectric polymer layer 134. When surfactant is applied to the wafer, the hydrophobic group 136*b* attaches the surfactant molecule 136 to the low K dielectric polymer layer 134.

Figure 3C:
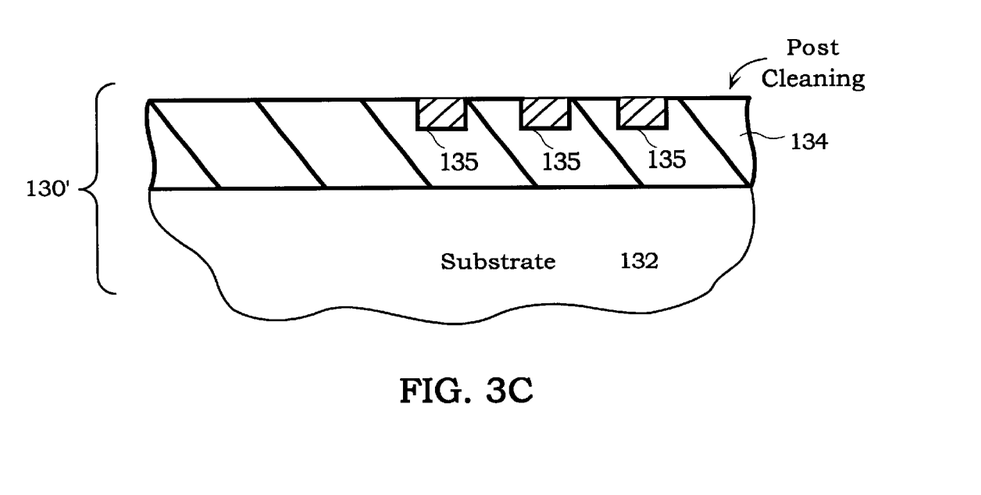
FIG. 3C shows the semiconductor wafer substantially free of particle contaminants and the applied cleaning solutions.

At the same time, the hydrophilic group 136*a* of the surfactant molecule 136 attracts de-ionized water and other cleaning fluids to enable the wetting of the surface of the low K dielectric polymer layer 134. Because the surface now wets, the top and bottom brushes 120*a* and 120*b* are now able to dislodge the particle and metal contaminants 138 and sweep them into the cleaning fluids by scrubbing the low K dielectric polymer layer 134. Any remaining particle contaminants 138 and the surfactant molecules 136 are then capable of being rinsed away with DI water (e.g., in the spin-rinse and dry station 108), leaving the wafer 130' substantially free of particle contaminants 138 and the applied cleaning solutions as shown in FIG. 3C.

Figure 4:
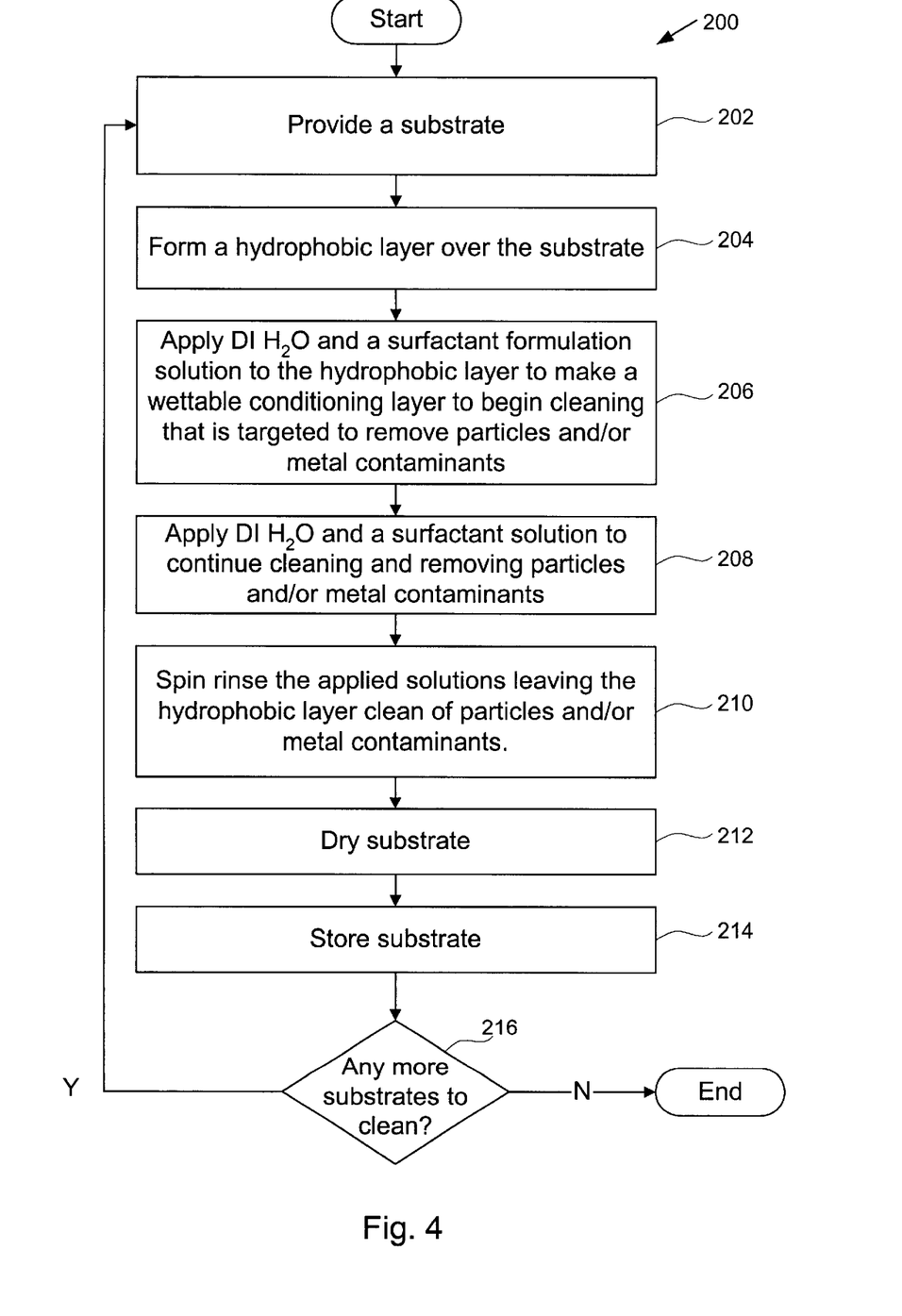
FIG. 4 is a flow chart illustrating a method of cleaning a wafer having a hydrophobic surface in accordance with one embodiment of the present invention.

FIG. 4 is a flow chart illustrating a method 200 of cleaning a wafer having a hydrophobic surface in accordance with one embodiment of the present invention. The method 200 starts at an operation 202 by providing a substrate, which can be, for example, any type of semiconductor wafer. An operation 204 forms a hydrophobic layer over the substrate. The hydrophobic layer is designed to provide insulation for metal lines in the substrate and preferably consists of a low K dielectric polymer (i.e., organic dielectric) material. De-ionized water and a surfactant formulation solution are applied to the hydrophobic layer to make a wettable conditioning layer in an operation 206. The surfactant formulation solution preferably includes surfactant and a chemical enhancer. The wettable conditioning layer begins cleaning of particles and/or metal contaminants from the hydrophobic layer.

An operation 208 will also apply de-ionized water, but discontinues the application of the chemical enhancer used in operation 206. Instead, a surfactant solution consisting of only surfactant is applied to the substrate. During this cleaning operation, the wettable conditioning layer continues to assist in the cleaning. Next, an operation 210 spin rinses the applied solutions leaving the hydrophobic layer substantially clean of particles and/or metal contaminants. An operation 212 then dries the substrate, and an operation 214 stores the substrate. In an operation 216 it is determined whether there are any more substrates to clean. In general, the sender station starts sending a new wafer to be cleaned to the first stage 106*a* after the wafer that was previously in the first stage 106*a* has been moved to the second stage 106*b*. Thus, if there are more wafers to clean, then the process repeats from operation 202. If not, the method 200 ends.

Figure 5:
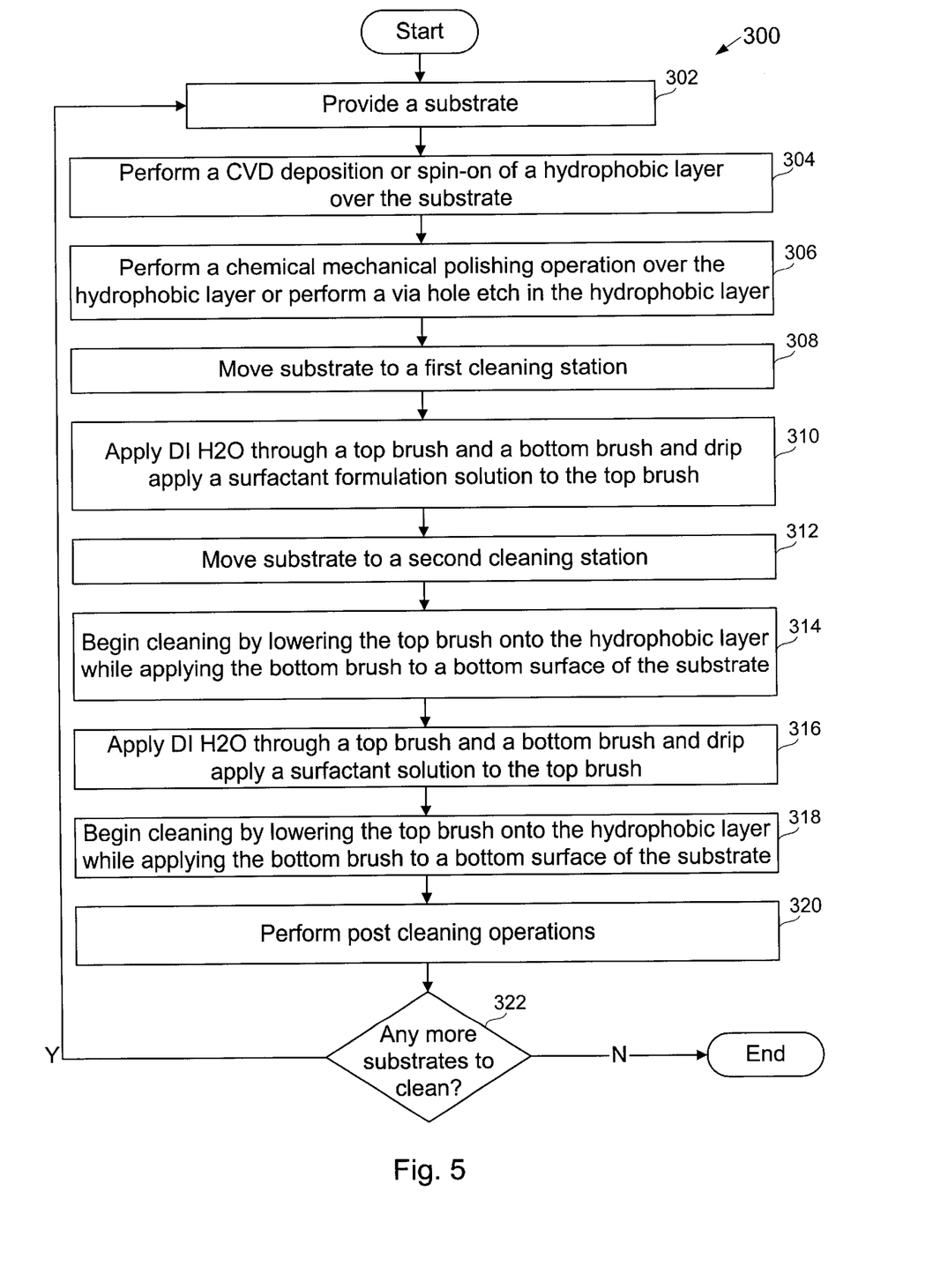
FIG. 5 is a more detailed flow chart diagram of a method of cleaning a wafer having a hydrophobic surface in accordance with another embodiment of the present invention.

FIG. 5 is a more detailed flow chart diagram of a method 300 of cleaning a wafer having a hydrophobic surface in accordance with another embodiment of the present invention. The method 300 starts with an operation 302 by providing a substrate, such as a semiconductor wafer. Next, a hydrophobic layer is formed over the substrate through any suitable chemical vapor deposition (CVD) technique in an operation 304.

In operation 306, the hydrophobic layer may be planarized by chemical mechanical polishing (CMP), or a via hole etch may be performed through the hydrophobic layer. As is well known, the CMP process will remove excess dielectric material from the hydrophobic layer, as well as excess deposited metal from any metal lines that may be formed in the hydrophobic layer. However, whether the hydrophobic s surface has just been deposited, processed through a CMP operation or a via etch, contaminants will most likely be present, therefore requiring a thorough cleaning.

Operation 308 moves the substrate to a first cleaning station. There, de-ionized water is applied through a top brush and a bottom brush and a surfactant formulation solution is drip applied to the top brush in an operation 310. Cleaning is begun in an operation 312 by lowering the top brush so that it scrubs the hydrophobic layer and dislodges particle contaminants on the surface of the hydrophobic layer into the cleaning solutions. At the same time, the bottom brush is applied to the bottom surface of the substrate. To complete the cleaning in the first cleaning station, an exit spray is used to remove/dislodge particle and metal contaminants before the wafer enters the second cleaning station for further cleaning. Next, an operation 314 moves the wafer to a second cleaning station.

In the second cleaning station, de-ionized water is again applied to the wafer through a top brush and a bottom brush in an operation 316. Surfactant solution is applied to the wafer by drip applying to the top brush. As in the first cleaning station, the top brush is lowered onto the hydrophobic layer to begin scrubbing away particle and metal contaminants from the layer surface in operation 318. The bottom brush is applied in the same way to the bottom surface of the substrate.

Next, an exit spray is used to further remove contaminants and most of the surfactant. Finally, an operation 320 performs post-cleaning operations, such as rinsing, drying and storing of the clean wafer. In operation 322, it is determined whether there are any more substrates to clean, and if there are, the method 300 repeats from operation 302. If not, the method 300 will end.

In another embodiment, the cleaning techniques of the present invention can also be used to clean other types of hydrophobic materials. Examples of these materials may be inorganic low-K dielectrics and metallization materials. Such metallization materials may include, for example, aluminum based metals, copper based metals, etc. Typically, cleaning of these exemplary materials is done after a chemical mechanical polishing operation is performed.

While this invention has been described in terms of several preferred embodiments, it will be appreciated that those skilled in the art upon reading the preceding specifications and studying the drawings will realize various alterations, additions, permutations and equivalents thereof. For example, the cleaning method described herein can be used to clean any type of hydrophobic surface, whether it be in the semiconductor arts (e.g., semiconductor wafers, flat panel display wafers, etc.), or other fields desiring very clean hydrophobic surfaces.

Furthermore, although a specific cleaning apparatus has been disclosed, other suitable cleaning apparatuses that implement the type of applied chemical solutions of the present invention can be used as well. It is therefore intended that the present invention include all such alterations, additions, permutations, and equivalents as fall within the true spirit and scope of the invention.

What is claimed is:

1. A method for cleaning an organic dielectric surface of a semiconductor substrate, comprising:

applying a first mixture of de-ionized water and a surfactant formulation solution containing a surfactant and a chemical enhancer to the organic dielectric surface;

scrubbing the organic dielectric surface using the first mixture;

applying a second mixture of de-ionized water and a surfactant solution to the organic dielectric surface, wherein the second mixture does not include the chemical enhancer;

scrubbing the organic dielectric surface using the second mixture; and spin-rinsing the semiconductor substrate using de-ionized water to complete a removal of any contaminants from the organic dielectric surface.

2. A method for cleaning an organic dielectric surface of a semiconductor substrate as recited in claim 1, wherein the surfactant of the first mixture has a concentration of between about 0.1% by volume and about 1% by volume, and the chemical enhancer of the first mixture has a concentration of between about 0.02% by weight and about 5% by weight.

3. A method for cleaning an organic dielectric surface or a semiconductor substrate as recited in claim 1, wherein the surfactant solution of the second mixture only includes surfactant.

4. A method for cleaning an organic dielectric surface of a semiconductor substrate as recited in claim 1, wherein the applying of the first mixture of the de-ionized water and the surfactant formulation solution to the organic dielectric surface is performed through the use of a first brush cleaning stage that is configured to perform the scrubbing of the organic dielectric surface.

5. A method for cleaning an organic dielectric surface of a semiconductor substrate as recited in claim 1, wherein the applying of the second mixture of the de-ionized water and the surfactant solution to the organic dielectric surface is performed through the use of a second brush cleaning stage that is configured to perform the scrubbing of the organic dielectric surface.

6. A method for cleaning an organic dielectric surface of a semiconductor substrate as recited in claim 3, wherein the surfactant of the first mixture has a concentration of between about 0.1% by volume and about 1% by volume.

7. A method for cleaning an organic dielectric surface of a semiconductor substrate as recited in claim 4, wherein the applying the first mixture further comprises:

drip applying the surfactant formulation solution to a top brush of the first brush cleaning stage.

8. A method for cleaning an organic dielectric surface of a semiconductor substrate as recited in claim 5, wherein the applying the second mixture further comprises:

drip applying the surfactant solution to a top brush of the second brush cleaning stage.

9. A method for cleaning an organic dielectric surface of a semiconductor substrate, comprising:

applying a first de-ionized water to a first brush, and applying a surfactant formulation solution containing a surfactant and a chemical enhancer to the first brush by drip applying the surfactant formulation solution to the first brush, wherein the surfactant formulation solution mixes with the first de-ionized water to form a first mixture;

applying the first mixture to the organic dielectric surface of the semiconductor substrate with the first brush, the applying being done by scrubbing the organic dielectric surface with the first brush using the first mixture in a first brush cleaning stage;

applying a second de-ionized water to a second brush, and applying a surfactant solution, which does not include the chemical enhancer to the second brush, by drip applying the surfactant solution to the second brush, wherein the surfactant solution mixes with the second de-ionized water to form a second mixture; and applying the second mixture to the organic dielectric surface of the semiconductor substrate with the second brush, the applying being done by scrubbing the organic dielectric surface with the second brush using the second mixture in a second brush cleaning stage, wherein the above steps are configured to assist in cleaning the organic dielectric surface of the semiconductor substrate.

10. A method for cleaning an organic dielectric surface of a semiconductor substrate as recited in claim 9, wherein the organic dielectric surface has metallization regions.

* * * * *